(12) United States Patent
Takahashi et al.

(10) Patent No.: US 7,704,803 B2
(45) Date of Patent: Apr. 27, 2010

(54) SEMICONDUCTOR DEVICE HAVING DIFFUSION LAYERS AS BIT LINES AND METHOD FOR MANUFACTURING THE SAME

(75) Inventors: Nobuyoshi Takahashi, Nara (JP); Fumihiko Noro, Toyama (JP); Kenji Sato, Shiga (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/337,023

(22) Filed: Dec. 17, 2008

(65) Prior Publication Data

US 2009/0104765 A1 Apr. 23, 2009

Related U.S. Application Data

(62) Division of application No. 11/405,451, filed on Apr. 18, 2006, now Pat. No. 7,476,943.

(30) Foreign Application Priority Data

Apr. 22, 2005 (JP) .............................. 2005-124657

(51) Int. Cl.
H01L 21/8246 (2006.01)
(52) U.S. Cl. ...................... 438/129; 438/301; 438/275; 257/E21.627
(58) Field of Classification Search ................. 438/129, 438/301, 275, FOR. 212; 257/E21.627
See application file for complete search history.

(56) References Cited

U.S. PATENT DOCUMENTS 5,960,283 A 9/1999 Sato 6,121,670 A 9/2000 Hisamune
6,319,781 B1 * 11/2001 Lee et al. ..................... 438/275

(Continued)

FOREIGN PATENT DOCUMENTS

JP 10-098170 4/1998

(Continued)

OTHER PUBLICATIONS

Japanese Notice of Reasons for Rejection, w/ English translation thereof, issued in Japanese Patent Application No. JP 2006-065189 dated Jan. 12, 2010.

*Primary Examiner*—George Fourson
(74) *Attorney, Agent, or Firm*—McDermott Will & Emery LLP

(57) ABSTRACT

A semiconductor device includes: a semiconductor region; a plurality of bit line diffusion layers formed in an upper portion of the semiconductor region and each extending in a row direction; a plurality of bit line insulating films formed on the bit line diffusion layers; a plurality of gate insulting films formed between the respective adjacent bit line diffusion layers on the semiconductor region; and a plurality of word lines each formed on the semiconductor region in a column direction and each intersecting with the bit line insulating films and the gate insulating films. Memory cells are formed at intersections of the gate insulating films and the word lines. A plurality of connection diffusion layers including connection parts electrically connected to the bit line diffusion layers are formed in the upper portion of the semiconductor region, and a level of upper faces of the connection parts is lower than a level of upper faces of the connection diffusion layers in the semiconductor region.

6 Claims, 9 Drawing Sheets

U.S. PATENT DOCUMENTS

| | | |
|---|---|---|
| 6,452,227 B2 | 9/2002 | Hashimoto et al. |
| 6,518,131 B1 * | 2/2003 | Lim ........................... 438/275 |
| 6,864,548 B2 | 3/2005 | Shinohara et al. |
| 7,262,456 B2 | 8/2007 | Kakoschke et al. |
| 7,429,509 B2 * | 9/2008 | Lee ........................... 438/243 |
| 2003/0230783 A1 * | 12/2003 | Willer et al. ................ 257/390 |
| 2004/0007721 A1 * | 1/2004 | Forbes et al. ................ 257/204 |
| 2004/0129986 A1 | 7/2004 | Kobayashi et al. |
| 2006/0014348 A1 * | 1/2006 | Wu ........................... 438/262 |

FOREIGN PATENT DOCUMENTS

JP  2002-50705  2/2002

* cited by examiner

SEMICONDUCTOR DEVICE HAVING DIFFUSION LAYERS AS BIT LINES AND METHOD FOR MANUFACTURING THE SAME

CROSS REFERENCE TO RELATED APPLICATIONS

This Non-provisional application is a Divisional of U.S. application Ser. No. 11/405,451, filed Apr. 18, 2006, now U.S. Pat. No. 7,476,943 claims priority under 35 U.S.C. §119 (a) of Japanese Patent Application No. 2005-124657 filed in Japan on Apr. 22, 2005, the entire contents of which are hereby incorporated by reference.

BACKGROUND ART

The present invention relates to a semiconductor device and a method for manufacturing it, and particularly relates to a semiconductor device using diffusion layers, as bit lines, provided in a semiconductor substrate and a method for manufacturing it.

Recently, semiconductor devices can reduce the area of a memory cell array if word lines and bit lines are intersected with each other with an insulating film interposed and a memory cell is formed at each of the intersections, and therefore, such semiconductor devices have grown in importance in association with miniaturization of semiconductor devices.

Such a conventional semiconductor structured as above and a method for manufacturing it will be described below with reference to FIG. 10A to FIG. 10C (see Japanese Patent Application Laid Open Publication No. 2002-050705A, for example).

First, as shown in FIG. 10A, there are provided a plurality of bit line diffusion layers 102 formed in a row direction in the upper portion of a semiconductor substrate 101 made of silicon (Si), a bit line insulating layer 103 formed on each of the bit line diffusion layers 102, a plurality of gate insulating films (not shown) formed on the semiconductor substrate 101 between the respective adjacent bit line diffusion layers 102, and a plurality of word lines 104 formed in a column direction on the bit line insulating films 103 so as to intersect with each bit line diffusion layer 102 and each gate insulting film. Herein, the row direction means the direction parallel to the paper of the drawing and the column direction means the direction perpendicular to the paper. The bit line diffusion layers 102 are thermal diffused to extend outwards of the end portions of the bit line insulating films 103.

Next, as shown in FIG. 10B, a plurality of connection diffusion layers 105 for electrically connecting the bit lines 102 to, for example, another circuit are formed using a dopant indicating the same conductivity as that of the bit line diffusion layers 102 so as to include the end portions of the bit line diffusion layers 102. Thus, overlapped connection parts 105a connected to the bit line diffusion layers 102 are formed.

Subsequently, as shown in FIG. 10C, a silicide layer 106 is formed on each of the word lines 104, the overlapped connection parts 105a, and the connection diffusion layers 105.

In the above conventional semiconductor device and the method for manufacturing it, however, the area (plane area) of the overlapped connection parts 105a must be increased in order to reduce the diffusion layer resistance of the overlapped connection parts 105a. This requires the bit line diffusion layers 102 to be thermal diffused largely after the formation of the bit line insulating films 103 on the bit line diffusion layers 102. Thermal treatment for largely diffusing the bit line diffusion layers 102 expands the diffusion layers in the memory cells excessively, inviting difficulty in miniaturization.

SUMMARY OF THE INVENTION

The present invention has been made in view of the foregoing and has its object of contemplating miniaturization of memory cells while securing the area of connection parts (overlapped connection parts) sufficiently and suppressing an increase in diffusion layer resistance of the connection parts without largely diffusing bit line diffusion layers after formation of bit line insulating films.

To attain the above object, a semiconductor device of the present invention has a structure in which the end portions of the bit line insulating films formed on bit line diffusion layers which are located on the side close to connection diffusion layers are removed.

Specifically, a semiconductor device in the present invention includes: a semiconductor region; a plurality of bit line diffusion layers formed in an upper portion of the semiconductor region and each extending in a row direction; a plurality of bit line insulating films formed on the bit line diffusion layers; a plurality of gate insulting films formed between the respective adjacent bit line diffusion layers on the semiconductor region; a plurality of word lines each formed on the semiconductor region in a column direction and each intersecting with the bit line insulating films and the gate insulating films; and memory cells formed at intersections of the gate insulating films and the word lines, wherein a plurality of connection diffusion layers including connection parts electrically connected to the bit line diffusion layers are formed in the upper portion of the semiconductor region, and a level of upper faces of the connection parts is lower than a level of upper faces of the connection diffusion layers in the semiconductor region.

In the semiconductor device according to the present invention, the plurality of bit line diffusion layers and the plurality of connection diffusion layers including the connection parts electrically connected to the bit line diffusion layers are formed in the upper portion of the semiconductor region, and the level of the upper faces of the connection parts is lower than the level of the upper faces of the connection diffusion layers in the semiconductor region. In other words, each part of the bit line insulating films formed on the bit line diffusion layers, which is located above the connection parts to the connection diffusion layers, are removed. This increases the connection area between the connection parts of the connection diffusion layers and the end portions of the bit line diffusion layers without relying on thermal diffusion. Whereby, the area of the connection parts are secured sufficiently even without diffusing the bit line diffusion layers largely so that an increase in diffusion layer resistance of the connection parts is suppressed, thereby attaining miniaturization of memory cells.

In the semiconductor device of the present invention, it is preferable that the connection parts are formed by overlapping end portions of the connection diffusion layers and end portions of the bit line diffusion layers.

In the semiconductor device of the present invention, it is preferable that a metal silicide layer is formed on at least some of the connection diffusion layers and at least some of the connection parts, and a level of an upper face of the metal silicide layer on each of the connection parts is lower than a level of an upper face of the metal silicide layer on each of the connection diffusion layers.

In the semiconductor device of the present embodiment, it is preferable that diffusion depth of the connection diffusion layers is greater than diffusion depth of the bit line diffusion layers.

In the semiconductor device of the present embodiment, it is preferable that a word line close to the connection parts out of the plurality of word lines is a dummy word line that does not contribute to operation, and each of the connection parts extends to part under the dummy word line in the semiconductor region.

It this case, it is further preferable that width of the dummy word line is greater than width of each of the word lines.

Moreover, preferably, the semiconductor device of the present embodiment further includes bit line contacts formed on the connection diffusion layers.

A semiconductor device manufacturing method in the present invention is directed to a method for manufacturing a semiconductor device that includes a semiconductor region; a plurality of bit line diffusion layers formed in an upper portion of the semiconductor region and each extending in a row direction; a plurality of bit line insulating films formed on the bit line diffusion layers; a plurality of gate insulting films formed between the respective adjacent bit line diffusion layers on the semiconductor region; a plurality of word lines each formed on the semiconductor region in a column direction and each intersecting with the bit line insulating films and the gate insulating films; and memory cells formed at intersections of the gate insulating films and the word lines, wherein the method includes the steps of: (a) forming the plurality of bit line diffusion layers each extending in the row direction in the upper portion of the semiconductor region; (b) forming the bit line insulating films on the plurality of bit line diffusion layers; (c) forming the plurality of word lines each extending in the column direction on the semiconductor region so as to intersect with each of the bit line diffusion layers and each of the bit line insulating films; (d) forming exposed regions for exposing respective ones of end portions of the bit line diffusion layers by removing regions of the bit line insulating films from end portions thereof to a word line close to the respective one end portions thereof, the region including at least the respective one end portions of the bit line diffusion layers; and (e) forming connection parts in regions including the exposed regions and connection diffusion layers electrically connected to the bit line diffusion layers through the connection parts by selectively forming, in the semiconductor region, a plurality of diffusion layers each extending in the row direction of the semiconductor region.

In the semiconductor device manufacturing method according to the present invention, the exposed regions exposing the respective ones of end portions of the bit line diffusion layers are formed by removing the regions including the corresponding end portions of the bit line insulating films. Then, by selectively forming the plurality of diffusion layers extending in the row direction in the semiconductor region, the connection parts are formed in the regions including the exposed regions and the connection diffusion layers electrically connected to the bit line diffusion layers through the connection parts are formed. Accordingly, the connection area between the connection parts of the connection diffusion layers and the one end portions of the bit line diffusion layers can be increased without relying on thermal diffusion. Whereby, the area of the connection parts of the connection diffusion layers can be secured sufficiently without largely diffusing the bit line diffusion layers by thermal diffusion, suppressing an increase in diffusion layer resistance of the connection parts to attain miniaturization of the memory cells.

In the above semiconductor device manufacturing method, it is preferable that the semiconductor region is made of silicon, and the method further includes a step (f) of forming, after the step (e), on at least some of the connection parts, a metal silicide layer formed by silicidation.

In the above semiconductor device manufacturing method, it is preferable that in the step (e), the connection diffusion layers are formed so as to have diffusion depth greater than diffusion depth of the bit line diffusion layers.

In the above semiconductor device manufacturing method, it is preferable that in the step (c), a word line out of the plurality of word lines which is close to a region where the connection parts are formed is formed as a dummy word line that does not contribute to operation, and in the step (e), each of the connection diffusion layers is formed so that each of the connection parts extends to part under the dummy word line.

In the above semiconductor device manufacturing method, it is preferable that in the step (c), the dummy word line is formed so as to have width greater than width of the word lines.

Preferably, the above semiconductor device manufacturing method further includes: a step (g) of forming, after the step (e), an interlayer insulating film on the semiconductor region including the plurality of connection diffusion layers and the plurality of word lines; and a step (h) of forming, in the interlayer insulating film, bit line contacts to be in electrical contact with the connection diffusion layers.

BRIEF DESCRIPTION OF THE DRAWINGS

FIG. 1A to FIG. 1C show a semiconductor device according to Embodiment 1 of the present invention, wherein FIG. 1A is a partial plan view thereof, FIG. 1B is a section taken along the line Ib-Ib in FIG. 1A, and FIG. 1C is a section taken along the line Ic-Ic in FIG. 1A.

DESCRIPTION OF THE PREFERRED EMBODIMENTS

Embodiment 1

Embodiment 1 of the present embodiment will be described with reference to drawings.

Figure 1A:
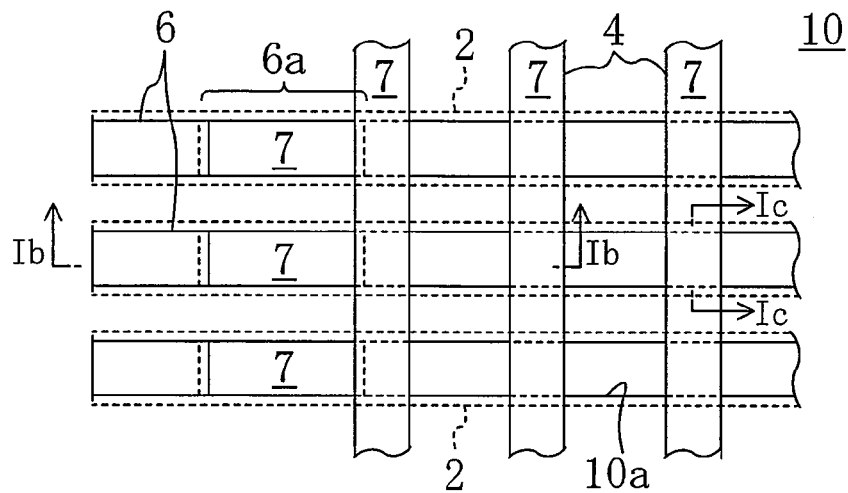
Figure 1B:
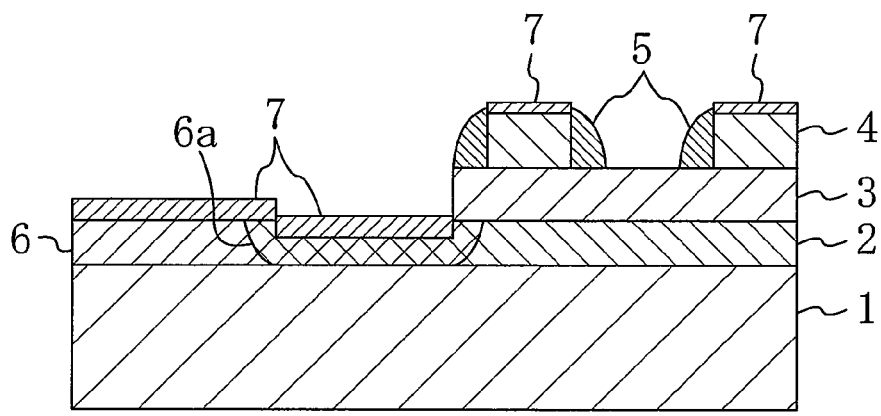
Figure 1C:
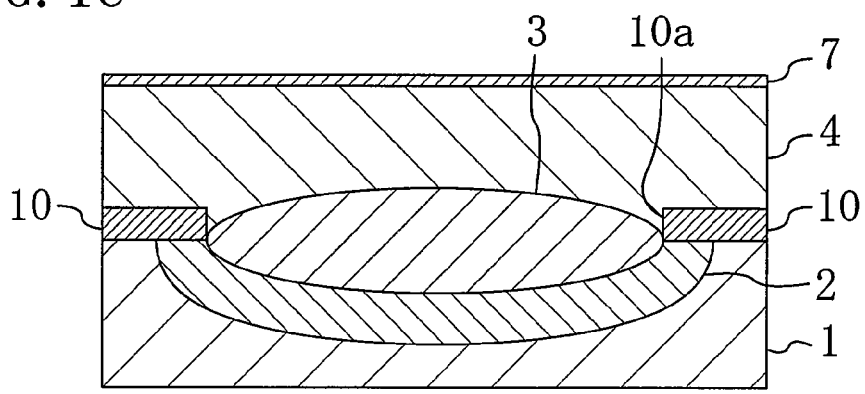

FIG. 1A to FIG. 1C show a semiconductor device according to Embodiment 1 of the present invention, wherein FIG. 1A is a partial plan view of the main part thereof, FIG. 1B is a section taken along the line Ib-Ib in FIG. 1A, and FIG. 1C is a section taken along the line Ic-Ic in FIG. 1A.

As shown in FIG. 1A to FIG. 1C, in the semiconductor device according to Embodiment 1, a gate insulating film 10 is formed entirely on the principal face of a semiconductor substrate 1 made of, for example, silicon (Si), wherein the gate insulating film 10 has a structure including an insulating film for storing charge, specifically, a structure generally called an ONO film in which a silicon nitride film is interposed between silicon oxide films, for example.

A plurality of openings 10a extending in, for example, a row direction are formed in the gate insulating film 10 to cut it into plural, and bit line diffusion layers 2 are formed in the upper portion of the semiconductor substrate 1 in exposed regions exposed through the openings 10a. Further, bit line insulating films 3 made of silicon oxide by, for example, thermal oxidation are formed on the bit line diffusion layers 2.

A plurality of word lines 4 made of polycrystalline silicon or amorphous silicon are formed on the gate insulating films 10 and the bit line diffusion layers 2 in a column direction so as to intersect with each bit line diffusion layer 2 and each gate insulating film 10 located between the respective adjacent bit line diffusion layers 2. Herein, each part where the gate insulating films 10 overlap with the word lines 4 serves as a charge storage section (a memory cell). Also, the bit line diffusion layers 2 facing with each other with the respective gate insulating films 10 interposed function as a source or a drain. A sidewall insulating film 5 made of silicon oxide is formed on each side face of each word line 4, as shown in FIG. 1B.

One of the end portions of each bit line insulating film 3 is removed to part close to the sidewall insulating film 5 on the outer side of the word lines 4. Connection diffusion layers 6 are formed in the row direction so as to include the exposed regions of the bit line diffusion layers 2, so that the end portions on the word line 4 side of the connection diffusion layers 6 including the exposed regions of the bit line diffusion layers 2 form connection parts 6a connected to the bit line diffusion layers 2.

Thus, the connection parts (overlapped connection parts) 6a of the connection diffusion layers 6 to the bit line diffusion layers 2 are larger than those in the conventional semiconductor device in which the connection parts 6a are formed only in the region where the bit line diffusion layers 2 are thermal diffused. This means that the connection parts 6a can be increased in area without largely diffusing the bit line diffusion layers 2 by thermal diffusion, and accordingly, memory cells can be miniaturized with no increase in diffusion layer resistance invited.

A metal silicide layer 7 silicided with titanium (Ti), tungsten (W), nickel (Ni), cobalt (Co), or the like are formed on each of the bit line diffusion layers 2, the connection diffusion layers 6 including the connection parts 6a, and the word lines 4.

In Embodiment 1, parts of the bit line insulating films 3 on the bit line diffusion layers 2, which are located above the connection parts 6a of the connection diffusion layers 6 to the bit line diffusion layers 2 are removed. Accordingly, the level of the upper faces of the connection parts 6a is lower than the level of the upper faces of the connection diffusion layers 6. Accordingly, the level of the upper face of the metal silicide layer 7 on each connection part 6a is lower than the level of the upper face of the metal silicide layer 7 on each connection diffusion layer 6.

A method for manufacturing the semiconductor device structured as above will be described below with reference the drawings.

FIG. 2A to FIG. 2D are sections showing in sequence the flow of the semiconductor device manufacturing method according to Embodiment 1 of the present embodiment.

First, though not shown, the gate insulating film as an ONO film is formed on the entirety of the principal face of the semiconductor substrate 1. Specifically, a first silicon oxide film having a thickness of approximately 5 nm is formed on the principal face of the semiconductor substrate by thermal oxidation, and a silicon nitride film having a thickness of approximately 15 nm is formed by chemical vapor deposition (CVD). Then, a second silicon oxide film having a thickness of approximately 10 nm is formed by thermal oxidation. In this way, the first silicon oxide film, the silicon nitride film, and the second silicon oxide film, which serve as a gate insulting film having the ONO structure, are formed.

Figure 2A:
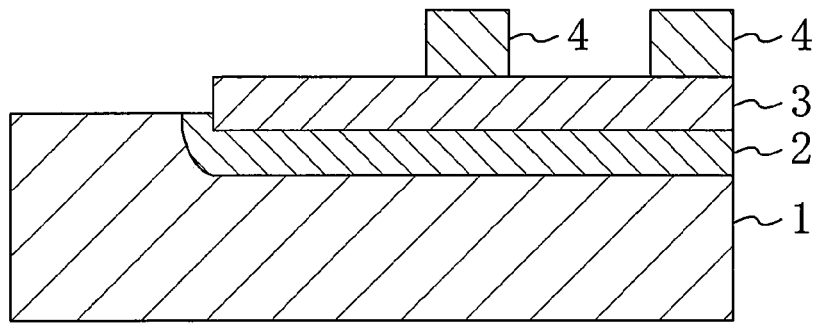
FIG. 2A to FIG. 2D are sections showing in sequence the flow of a semiconductor device manufacturing method according to Embodiment 1 of the present embodiment.

Next, as shown in FIG. 2A, a plurality of bit line diffusion layers 2 having a diffusion depth of approximately 50 nm (immediately after implantation) are formed so as to extend in the row direction in a predetermined region of the semiconductor substrate 1, and bit line insulating films 3 are formed on the bit line diffusion layers 2. Specifically, a resist pattern having openings corresponding to an opening pattern for forming the bit line diffusion layers 2 is formed on the gate insulating film by lithography. Then, the gate insulating film is removed by etching with the use of the thus formed resist pattern as a mask so that the gate insulating films from which the semiconductor substrate 1 is exposed have the opening pattern for forming the bit line diffusion layers 2. Subsequently, the semiconductor substrate 1 is subjected to ion implantation of an n-type impurity, for example, arsenic (As) or phosphorous (P) ion with the use of the resist pattern and the gate insulating film which have the opening pattern for forming the bit line diffusion layers 2 as a mask under the implantation conditions of approximately 30 keV acceleration energy and approximately $2.5 \times 10^{15}/cm^2$ dosage to form the plurality of bit line diffusion layers 2 in the upper portion of the semiconductor substrate 1. Next, after removing the resist pattern, the bit line insulating films 3 having a thickness of approximately 50 nm are formed on the upper portions of the thus formed bit line diffusion layers 2 by thermal oxidation. Herein, thermal treatment for forming the bit line insulating films 3 thermal diffuses the end portions of the bit line diffusion layers 2, resulting in expansion of the bit line diffusion layers 2 outwards of the end portions of the bit line insulating films 3 to some extent. Subsequently, a polycrystalline silicon film in which an n-type impurity is doped is deposited on the gate insulting films 10 and the bit line insulating film 3 on the semiconductor substrate 1 by CVD to have a thickness of approximately 200 nm. Thereafter, the thus deposited polycrystalline silicon film is subjected to patterning in the column direction intersecting with each bit line diffusion layer 2 to form a plurality of word lines 4.

Figure 2B:
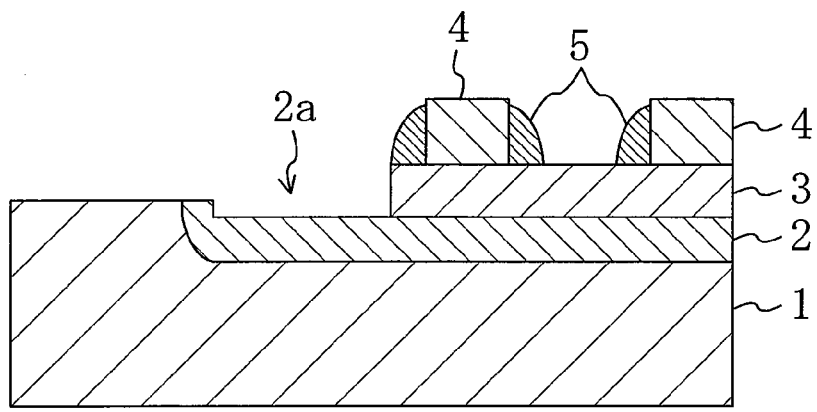

Thereafter, as shown in FIG. 2B, a silicon oxide film is deposited entirely so as to cover the word lines 4 by CVD and the thus deposited silicon oxide film is subjected to etch back by anisotropic dry etching so that a sidewall insulating film 5 made of silicon oxide is formed on each side of each word line 4. Then, etching is performed to selectively remove regions of the bit line insulating films 3 from respective ones of the end portions thereof to the word line 4 close to the respective one end portions thereof to form exposed regions 2a exposing the corresponding end portions of the bit line diffusion layers 2. It is noted that the step of forming the exposed regions 2a in the bit line diffusion layers 2 may be carried out simultaneously with the etch back step for forming the sidewall insulating films 5. Wherein, in this case, it is preferable to bury parts between the respective adjacent word lines 4 with the sidewall insulating films 5.

Figure 2C:
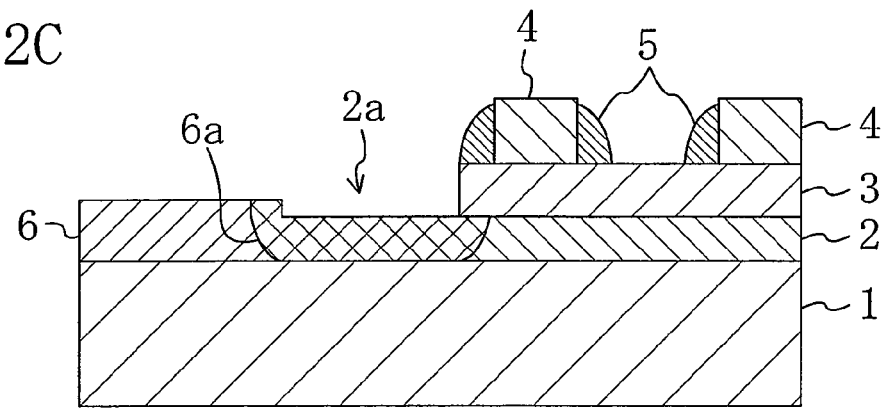

Subsequently, as shown in FIG. 2C, the connection diffusion layers 6 for establishing electrical connection to another circuit such as a peripheral circuit or the like are selectively formed in the direction extending outward of the exposed regions 2a of the bit line diffusion layers 2 in the row direction of the semiconductor substrate 1. Referring to the ion implantation conditions for this selective formation, for example, arsenic (As) or phosphorous (P) ion is used and the acceleration energy and the dosage are set to approximately 40 keV and approximately $2.5 \times 10^{15}/cm^2$.

Thus, the connection parts 6a are formed between the bit line diffusion layers 2 and the connection diffusion layers 6, wherein the connection parts 6a expand large by removing the end portions of the bit line insulating films 3, compared with those in the conventional case in which the connection parts 6a are formed only in the diffusion regions where the bit line diffusion layers 2 are thermal diffused. The bit line diffusion layers 2 and the connection diffusion layers 6 are connected to each other electrically through the connection parts 6a having such large area, namely, having small diffusion layer resistance.

Figure 2D:
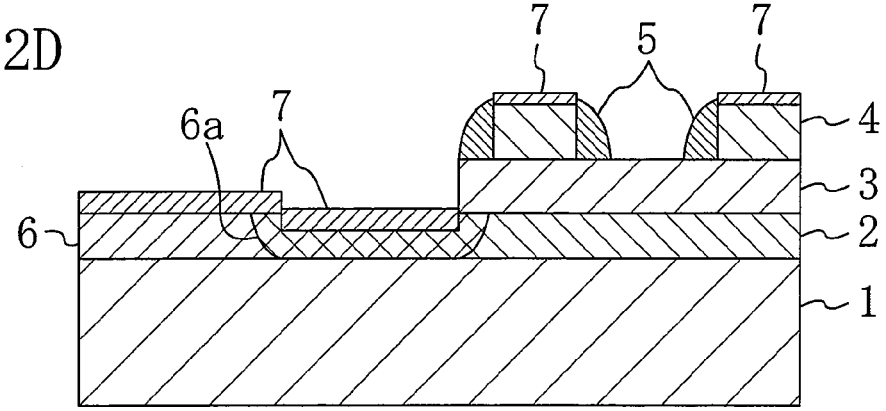

Next, as shown in FIG. 2D, a metal film made of titanium (Ti) is formed on each of the word lines 4 and the connection diffusion layers 6 including the connection parts 6a by vacuum evaporation or the like and the thus deposited metal films are subjected to heat treatment to form the metal silicide layers 7. Herein, the connection parts 6a are formed below the end portions of the bit line insulating films 3, which have been removed, so that the level of the upper faces of the connection parts 6a is lower than the level of the upper faces of the connection diffusion layers 6. This is because, as shown in FIG. 1C, oxidation proceeds in the upper portion of the semiconductor substrate 1 with a result that the level of each interface between the bit line diffusion layers 2 and the bit line insulating films 3 becomes lower than the level of the principal face of the semiconductor substrate 1. Accordingly, after silicidation, the metal silicide layer 7 on each connection part 6a is lower in level than the metal silicide layer 7 on each connection diffusion layer 6.

It is noted that the metal silicide layer 7 is formed on each of the word lines 4 and the connection diffusion layers 6 including the connection parts 6a in Embodiment 1 but may be formed at least one of or some part of any of the word lines 4, the connection parts 6a, and the connection diffusion layers 6. Alternatively, the metal silicide layer 7 may not be formed necessarily.

As described above, in the semiconductor device and the semiconductor device manufacturing method according to Embodiment 1, the exposed regions 2a are formed by removing the end portions of the bit line insulating films 3 provided on the bit line diffusion layers 2, which are located on the end portion on the connection diffusion layer 6 side of the bit line diffusion layers 2, and the connection diffusion layers 6 are formed so as to include the thus formed exposed regions 2a. Hence, the plane area of the connection parts 6a where the connection diffusion layers 6 overlap with the bit line diffusion layers 2 can be increased without relying on thermal diffusion, attaining miniaturization of the memory cell easily.

Modified Example 1 in Embodiment 1

Modified Example 1 in Embodiment 1 of the present invention will be described below with reference to the drawings.

Figure 3:
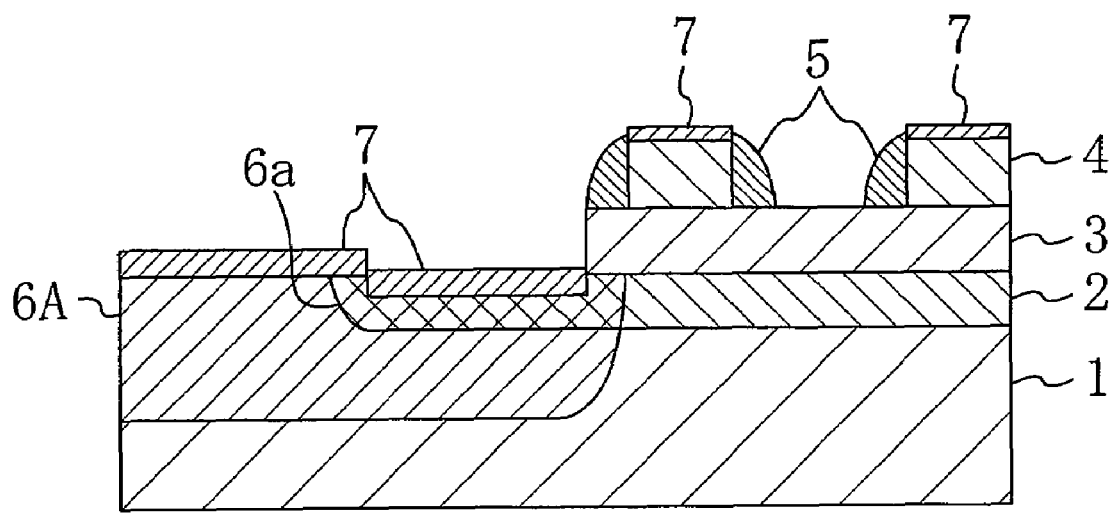
FIG. 3 is a section showing a semiconductor device according to Modified Example 1 in Embodiment 1 of the present invention.

FIG. 3 is a section in the row direction of a semiconductor device according to Modified Example 1 in Embodiment 1 of the present invention. In FIG. 3, the same reference numerals are assigned to the same elements as those in FIG. 1 and the description thereof is omitted.

As shown in FIG. 3, in the semiconductor device according to Modified Example 1, connection diffusion layers 6A are formed so as to have diffusion depth greater than the diffusion depth of the bit line diffusion layers 2.

This increases the distance between the upper face of each connection part 6a and the end portion of each connection diffusion layer 6A to suppress occurrence of leakage current between the upper faces of the connection parts 6a and the end portions of the connection diffusion layers 6A, thereby further stabilizing the operation of the semiconductor device.

A method for manufacturing the semiconductor device structured as above will be described below with reference to the drawings.

Figure 4A:
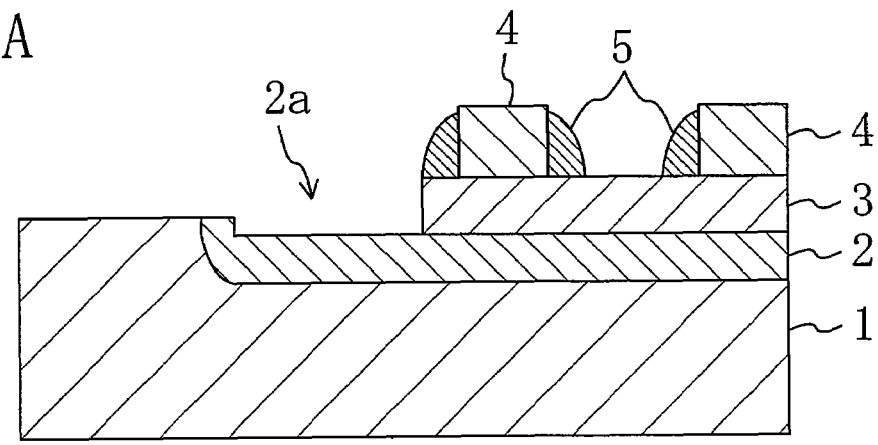
FIG. 4A to FIG. 4C are sections showing in sequence the flow of a semiconductor device manufacturing method according to Modified Example 1 in Embodiment 1 of the present invention.
Figure 4B:
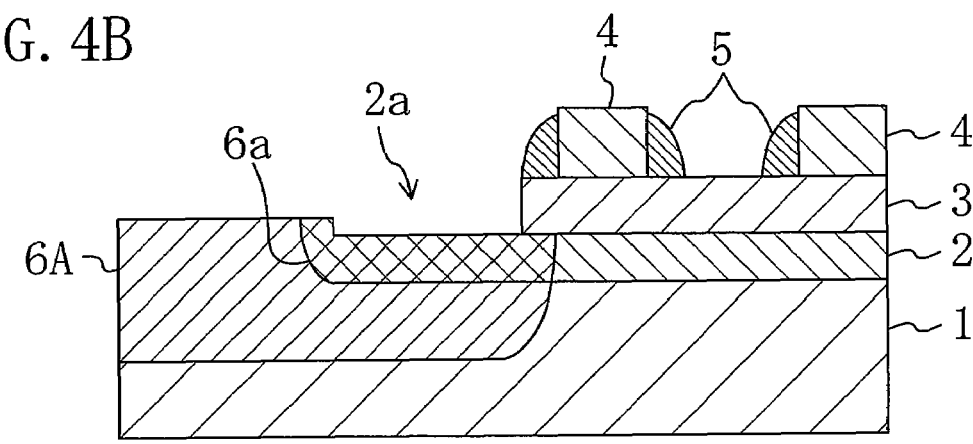
Figure 4C:
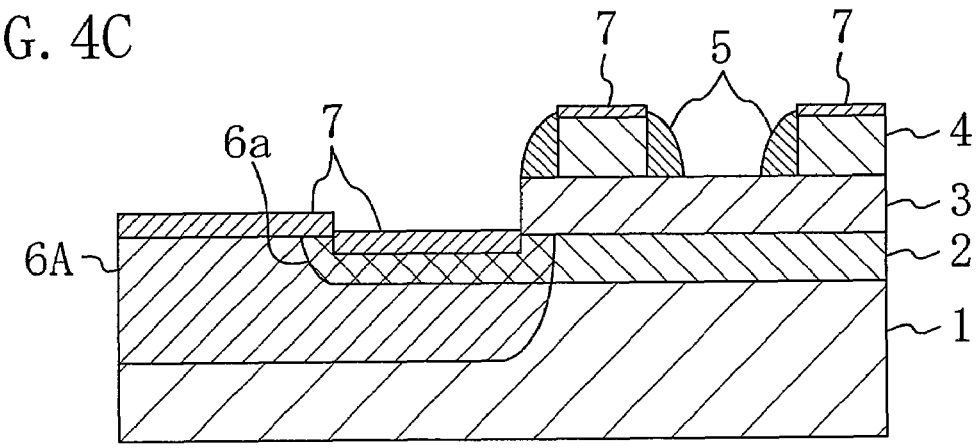

FIG. 4A to FIG. 4C are sections showing in sequence the flow of the semiconductor device manufacturing method according to Modified Example 1 in Embodiment 1 of the present invention.

First, as shown in FIG. 4A, similarly to Embodiment 1, the silicon oxide film deposited by CVD is etch backed by anisotropic etching to form the sidewall insulating film 5 on each side of each word line 4. Then, regions of the bit line insulating films 3 from the respective ones of the end portions thereof to the word line 4 close to the respective one end portions thereof are removed by selective etching to form the expose regions 2a exposing the corresponding end portions of the bit line diffusion layers 2. It is noted that in the present modified example, also, the step of forming the exposed region 2a in each bit line diffusion layer 2 may be carried out simultaneously with the etch back step for forming the sidewall insulating films 5. Wherein, in this case, it is preferable to bury parts between the respective adjacent word lines 4 with the sidewall insulating films 5.

Subsequently, as shown in FIG. 4B, the connection diffusion layers 6A for establishing electrical connection to, for example, a peripheral circuit or the like are selectively formed in the direction extending outwards of the exposed regions 2a of the bit line diffusion layers 2 in the row direction of the semiconductor substrate 1. Referring to the ion implantation conditions for this selective formation, for example, arsenic (As) or phosphorous (P) ion is used and the acceleration energy and the dosage are set to approximately 50 keV and approximately $2.5 \times 10^{15}/cm^2$ so that the diffusion depth of the connection diffusion layers 6A becomes greater than the diffusion depth of the bit line diffusion layers 2. This forms the connection parts 6a between the bit line diffusion layers 2 and the connection diffusion layers 6A, wherein the connection parts 6a expand large by removing the end portions of the bit line insulating films 3, compared with those in the conventional case in which the connection parts 6a are formed only in the diffusion region where the bit line diffusion layers 2 are thermal diffused. The bit line diffusion layers 2 and the connection diffusion layers 6A are connected to each other electrically through the connection parts 6a having such large area, namely, having small diffusion layer resistance.

Next, as shown in FIG. 4C, a metal silicide layer 7 is formed on each of the word lines 4 and the connection diffusion layers 6A including the connection parts 6a. Herein, similarly to Embodiment 1, the level of the metal silicide layer 7 on each connection part 6a is lower than the level of the metal silicide layer 7 on each connection diffusion layer 6A.

It is noted that herein, also, the metal silicide layers 7 may be formed at least one of or some part of any of the word lines 4, the connection parts 6a, and the connection diffusion layers 6A. Alternatively, the metal silicide layer 7 may not be formed necessarily.

As described above, according to Modified Example 1 in Embodiment 1, similarly to Embodiment 1, miniaturization of the memory cells can be attained with no increase in diffusion layer resistance of the connection parts 6a invited.

Besides, in Modified Example 1, the diffusion depth of the connection diffusion layers 6A is set greater than the diffusion depth of the bit line diffusion layers 2, enabling an increase in distance between the upper face of each connection part 6a and the end portion of each connection diffusion layer 6A, as described above. This suppresses leakage current, which occurs between the upper faces of the connection parts 6a and the end portions of the connection diffusion layers 6A, to contemplate stabilization of the operation of the semiconductor device.

In addition, the effect of suppressing the leakage current becomes significant in the case where the metal silicide layer 7 is formed on the connection parts 6a because the leakage current is liable to be caused between the metal silicide layer 7 and the semiconductor substrate 1 by stress and the like of the thus formed metal silicide layer 7.

It is noted that the diffusion depth of the connection diffusion layers 6A is preferably within the range between 1.1 times and two times the diffusion depth of the bit line diffusion layers 2.

Modified Example 2 in Embodiment 1

Modified Example 2 in Embodiment 1 of the present invention will be described below with reference to the drawings.

Figure 5:
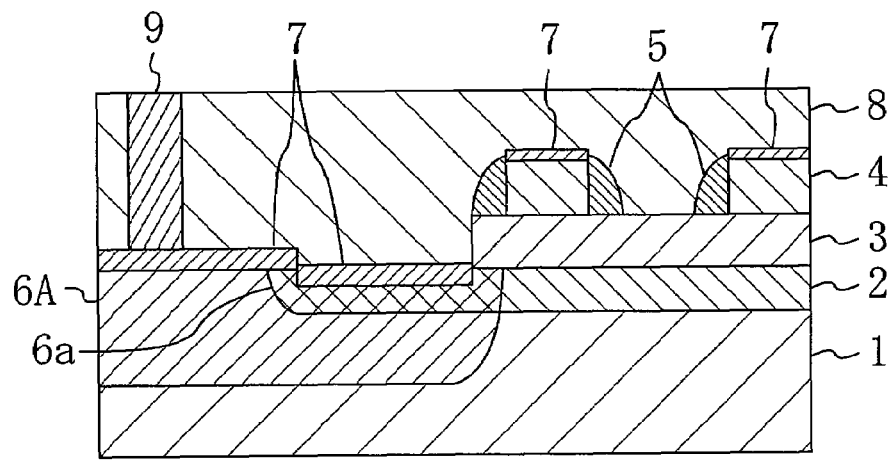
FIG. 5 is a section showing a semiconductor device according to Modified Example 2 in Embodiment 1 of the present invention.

FIG. 5 is a section in the row direction of a semiconductor device according to Modified Example 2 in Embodiment 1 of the present invention. In FIG. 5, the same reference numerals are assigned to the same elements as those in FIG. 1 and FIG. 3 and the description thereof is omitted.

As shown in FIG. 5, similarly to that in Modified Example 1, the semiconductor device according to Modified Example 2 is provided with the connection diffusion layers 6A of which diffusion depth is greater than the diffusion depth of the bit line diffusion layers 2 and contacts 9 for establishing electrical contact with the connection diffusion layers 6A.

Specifically, an interlayer insulating film 8 made of, for example, silicon oxide is formed on the entirety of the semiconductor substrate 1 including the metal silicide layers 7, the bit line insulating films 3, and the sidewall insulating films 5, and the contacts (bit line contacts) 9 connected to the metal silicide layers 7 and made of tungsten are formed above the connection diffusion layers 6 in the interlayer insulating film 8. The contacts 9 are electrically connected to a wiring (not shown) on the interlayer insulating film 8.

A method for manufacturing the semiconductor device structured as above will be described below with reference to the drawings.

Figure 6A:
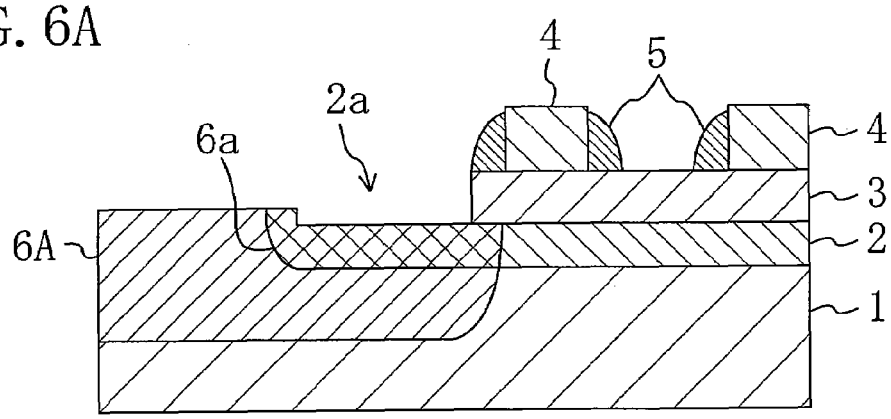
FIG. 6A and FIG. 6B are sections showing in sequence the flow of a semiconductor device manufacturing method according to Modified Example 2 in Embodiment 1 of the present invention.
Figure 6B:
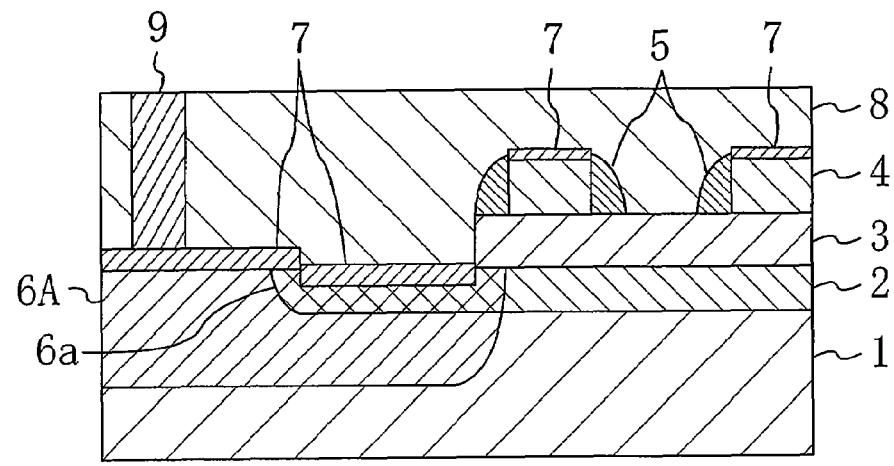

FIG. 6A and FIG. 6B are sections showing the sequence flow of the semiconductor device manufacturing method according to Modified Example 2 in Embodiment 1 of the present invention.

First, as shown in FIG. 6A, the connection diffusion layers 6A for establishing electrical connection to, for example, a peripheral circuit or the like are selectively formed in the direction extending outwards of the exposed regions 2a of the bit line diffusion layers 2 in the row direction of the semiconductor substrate 1 under the same ion implantation conditions as those in Modified Example 1.

Next, as shown in FIG. 6B, the metal silicide layer 7 is formed on each of the word lines 4 and the connection diffusion layers 6A including the connection parts 6a. Accordingly, herein, the level of the upper face of the metal silicide layer 7 on each connection part 6a is lower than the level of the upper face of the metal silicide layer 7 on each connection diffusion layers 6A, similarly to those in Embodiment 1 and Modified Example 1.

It is noted that in Modified Example 2, also, the metal silicide layer 7 may be formed at least one of or some parts of any of the word lines 4, the connection part 6a, and the connection diffusion layers 6. Alternatively, the metal silicide layer 7 may not be formed necessarily.

Subsequently, after the formation of the metal silicide layers 7, the interlayer insulating film 8 made of silicon oxide is formed entirely on the word lines 4 and the connection diffusion layers 6A including the connection parts 6a by, for example, CVD. Then, contact holes for exposing the metal silicide layers 7 on the connection diffusion layers 6A are formed in the interlayer insulating film 8 by lithography and dry etching. Next, a metal film of tungsten or the like is deposited on the interlayer insulating film 8 by CVD or sputtering so as to fill the contact holes. Thereafter, the metal film deposited on the interlayer insulating film 8 is removed by, for example, chemical mechanical polishing (CMP) to obtain the contacts 9 formed in the contact holes of the interlayer insulating film 8.

As described above, Modified Example 2 in Embodiment 1 attains the same effects as those in Embodiment 1 and Modified Example 1, and enables the bit line diffusion layers 2 to be in electrical contact with an upper wiring layer (not shown) through the connection diffusion layers 6A and the contacts 9 functioning as bit line contacts.

Embodiment 2

Embodiment 2 of the present invention will be described below with reference to the drawings.

Figure 7:
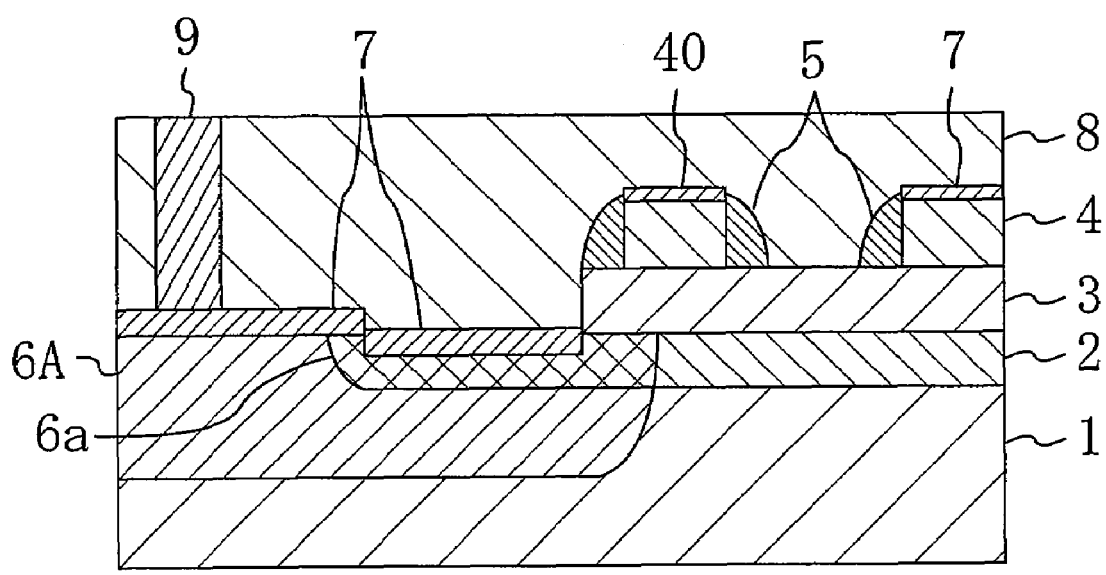
FIG. 7 is a section showing a semiconductor device according to in Embodiment 2 of the present invention.

FIG. 7 is a section in the row direction of a semiconductor device according to Embodiment 2 of the present invention. In FIG. 7, the same reference numerals are assigned to the same elements as those in FIG. 1 and FIG. 5 and the description thereof is omitted.

As shown in FIG. 7, in Embodiment 2, the word line close to the connection parts 6a of the connection diffusion layers 6A out of the plurality of word lines 4 extending in the column direction is used as a dummy word line 40 that does not contribute to the operation of the semiconductor device.

Since the word line 4 close to the connection parts 6a of the connection diffusion layers 6A serves as the dummy word line 40 in this way, characteristic variation of the memory cells can be prevented even if the connection parts 6a would diffuse inwards of the cell array along the bit line diffusion layers 2 from the end portions thereof and would reach the memory cells.

It is noted that in Embodiment 2, the metal silicide layer 7 is formed on each of the word lines 4, the dummy word line 40, and the connection diffusion layers 6A including the connection parts 6a but may not formed on the dummy word line 40.

A method for manufacturing the semiconductor device structured as above will be described below with reference to the drawings.

FIG. 8A to FIG. 8D are sections showing in sequence the flow of the semiconductor device manufacturing method according to Embodiment 2 of the present invention.

Figure 8A:
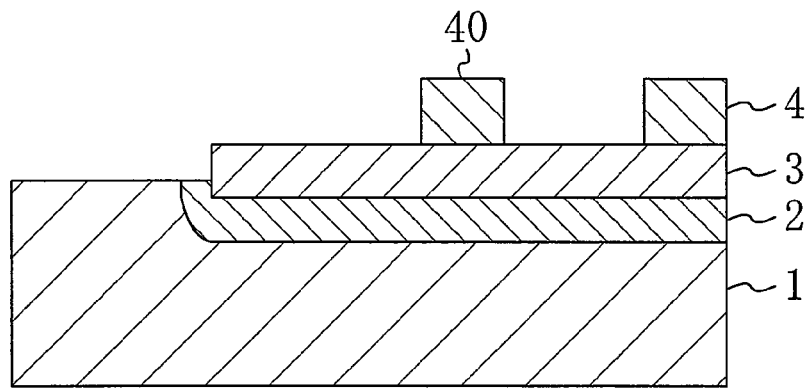
FIG. 8A to FIG. 8D are sections showing in sequence the flow of a semiconductor device manufacturing method according to Embodiment 2 of the present invention.

First, as shown in FIG. 8A, similarly to Embodiment 1, the gate insulating film as an ONO film is formed on the entirety of the principal face of the semiconductor substrate 1, and an opening pattern for forming the bit line diffusion layers 2 extending in the row direction is formed selectively in the thus formed gate insulating film. Then, the plurality of bit line diffusion layers 2 are formed in the upper portion of the principal surface portion of the semiconductor substrate 1 by ion implantation. Next, the bit line insulating films 3 are formed on the bit line diffusion layers 2 by thermal oxidation. Subsequently, a plurality of word lines 4 and one dummy word line 40 which are extending in the column direction are formed selectively on the bit line insulating films 3 and the gate insulating film so as to intersect with each bit line diffusion layer 2. Herein, the dummy word line 40 is located at the end portions of the bit line diffusion layers 2 which are located on the side where the connection diffusion layers 6A are formed.

Wherein, thermal treatment for forming the bit line insulating films 3 thermal diffuses the bit line diffusion layers 2 at the end portions of the bit line insulating films 3, resulting in expansion of the bit line diffusion layers 2 outwards of the end portions of the bit line insulating films 3 to some extent.

Figure 8B:
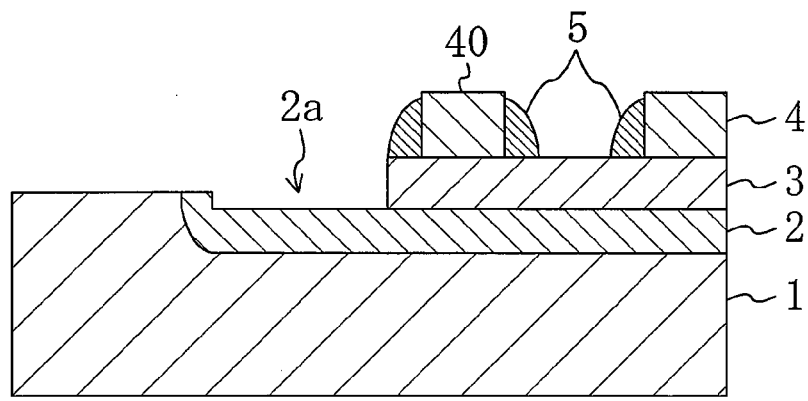

Subsequently, as shown in FIG. 8B, similarly to Embodiment 1, the silicon oxide film deposited by CVD is etched back by anisotropic dry etching to form the sidewall insulating film 5 on each side of each word line 4 and of the dummy word line 40. Next, the exposed regions 2a exposing respective ones of the end portions of the bit line diffusion layers 2 are formed by removing by selectively etching each region of the bit line insulating film 3 from the corresponding end portions thereof to the dummy word line 40 close to the corresponding end portions thereof. It is noted that in the present embodiment, also, the step of forming the exposed region 2a in each bit line diffusion layer 2 may be carried out simultaneously with the etch back step for forming the sidewall insulating films 5. Wherein, in this case, it is preferable to bury parts between the respective adjacent word lines 4 including the dummy word line 40 with the sidewall insulating films 5.

Figure 8C:
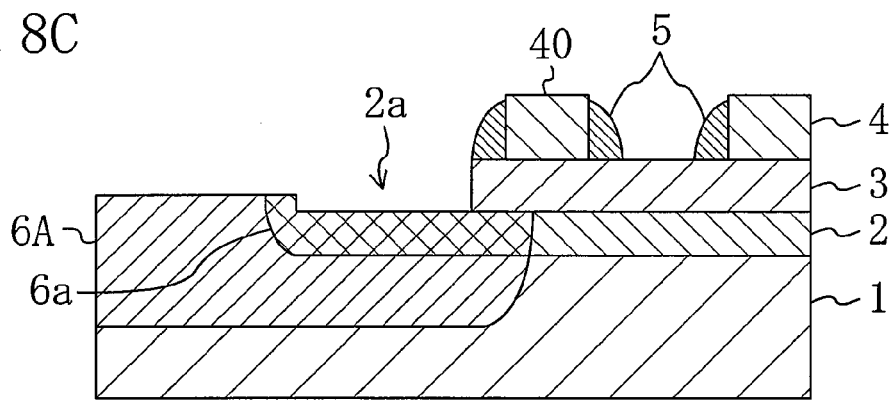

Next, as shown in FIG. 8C, similarly to Modified Example 1 in Embodiment 1, the connection diffusion layers 6A for establishing electrical connection to, for example, a peripheral circuit or the like are selectively formed in the direction extending outwards of the exposed regions 2a of the bit line diffusion layers 2 in the row direction of the semiconductor substrate 1. As a result, the connection parts 6a are formed between the bit line diffusion layers 2 and the connection diffusion layers 6A with their areas increased by removing the end portions of the bit line insulating films 3. The bit line diffusion layers 2 and the connection diffusion layers 6 are connected to each other electrically through the connection parts 6a having such large area, namely, having small diffusion layer resistance.

Figure 8D:
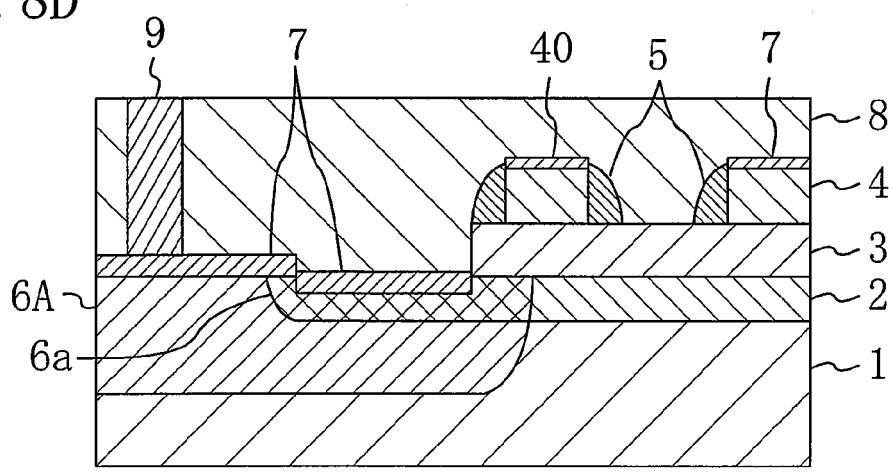

Subsequently, as shown in FIG. 8D, the metal silicide layer 7 is formed on each of the word lines 4 and the connection diffusion layers 6A including the connection parts 6a. Herein, similarly to Embodiment 1, the level of the metal silicide layer 7 on each connection part 6a is lower than the level of the metal silicide layer 7 on each connection diffusion layer 6A. This is because, as described in Embodiment 1, oxidation proceeds in the upper portion of the semiconductor substrate 1, with a result that the level of each interface between the bit line diffusion layers 2 and the bit line insulating films 3 becomes lower than the level of the principal face of the semiconductor substrate 1.

It is noted that in Embodiment 2, also, the metal silicide layer 7 may be formed at least one of or some part of any of the word lines 4, the dummy word line 40, the connection parts 6a, and the connection diffusion layers 6. Alternatively, the metal silicide layer 7 may not be formed necessarily. Especially, it may not be formed on the dummy word line 40.

Next, after the formation of the metal silicide layers 7, the interlayer insulating film 8 made of silicon oxide is formed on the entirety including the word lines 4 and the connection diffusion layers 6A including the connection parts 6a by, for example, CVD. Then, contact holes for exposing the metal silicide layers 7 on the connection diffusion layers 6A are formed in the interlayer insulating film 8 by lithography and dray etching. Then, a metal film of tungsten or the like is deposited on the interlayer insulating film 8 by CVD or sputtering so as to fill the contact holes. Thereafter, the metal film deposited on the interlayer insulating film 8 is removed by, for example, CMP to obtain the contacts 9 formed in the contact holes of the interlayer insulating film 8.

Similarly to Embodiment 1 as described above, in Embodiment 2, the exposed regions 2a are formed by removing the end portions of the bit line insulating films 3 which are located on the bit line diffusion layers 2 on the side where the connection diffusion layers 6A are formed, and the connection diffusion layers 6A are formed so as to include the thus formed exposed regions 2a. Hence, the plane area of the connection parts 6a where the connection diffusion layers 6A overlap with the bit line diffusion layers 2 can be increased without relying on thermal diffusion, attaining miniaturization of the memory cell easily.

In Embodiment 2, the effects as those in Embodiment 1 and each modified example therein can be obtained. Further, since the word line close to the connection parts 6a of the connection diffusion layers 6A is used as the dummy word line 40, the following effect can be obtained in addition.

Namely: With no dummy word line 40, if the mask for ion implantation for forming the connection diffusion layers 6A would be displaced inwards of the cell array, the connection parts 6a would be diffused under the word lines 4 by thermal treatment after the ion implantation to cause characteristic variation. However, according to Embodiment 2, arrangement of the dummy word line 40 out of the plurality of word lines 4 at a position close to the connection parts 6a causes the ion implanted for forming the connection diffusion layers 6A to be retained under the dummy word line 40, preventing the characteristic variation of the memory cells.

Modified Example in Embodiment 2

One modified example in Embodiment 2 of the present invention will be described below with reference to the drawing.

Figure 9:
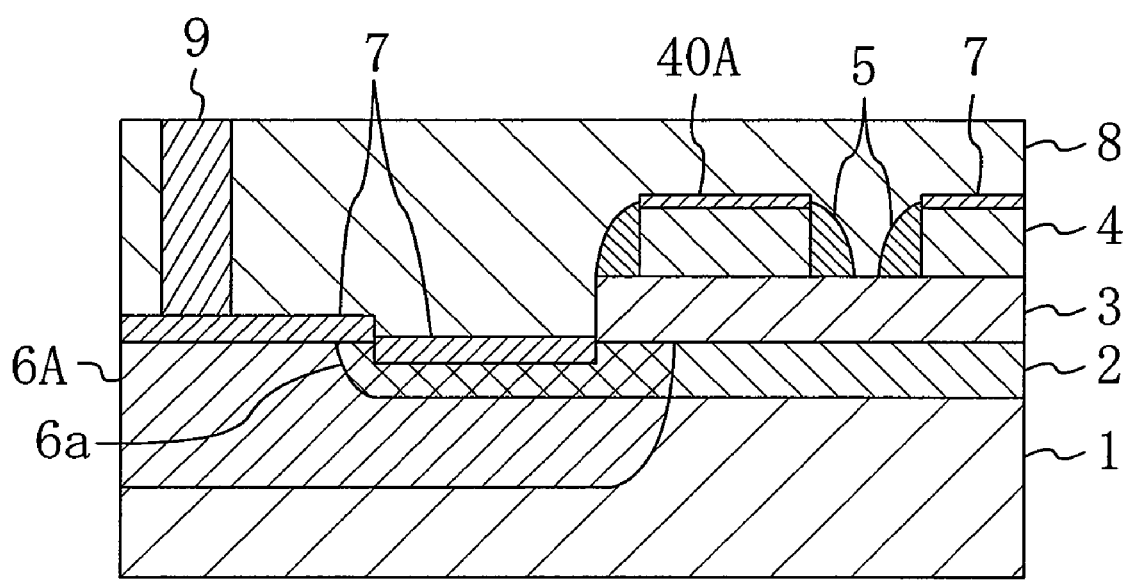
FIG. 9 is a section showing a semiconductor device according to one modified example in Embodiment 2 of the present invention.
Figure 10A:
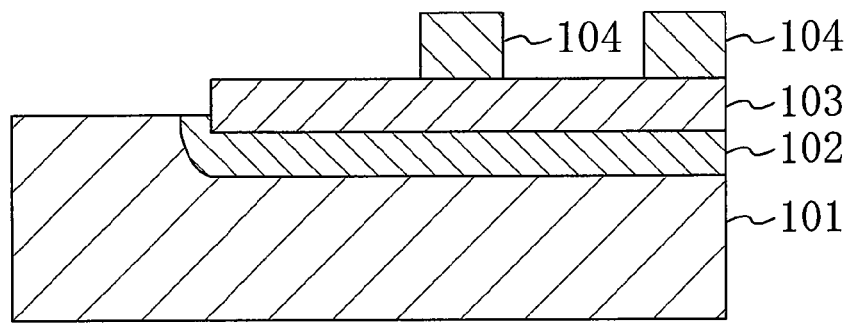
FIG. 10A to FIG. 10C are sections showing in sequence the flow of a conventional semiconductor device manufacturing method.
Figure 10B:
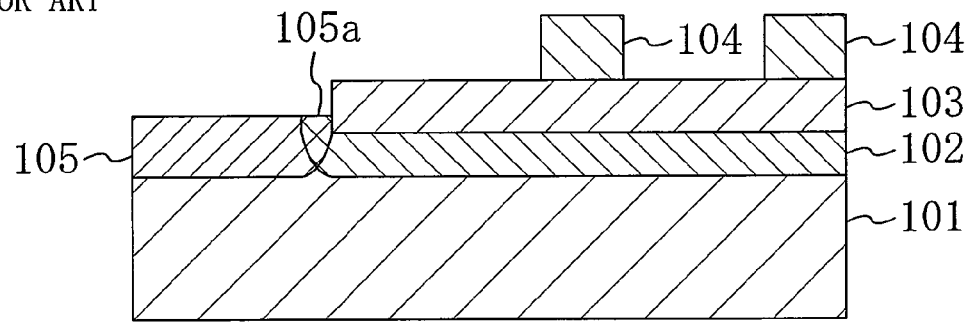
Figure 10C:
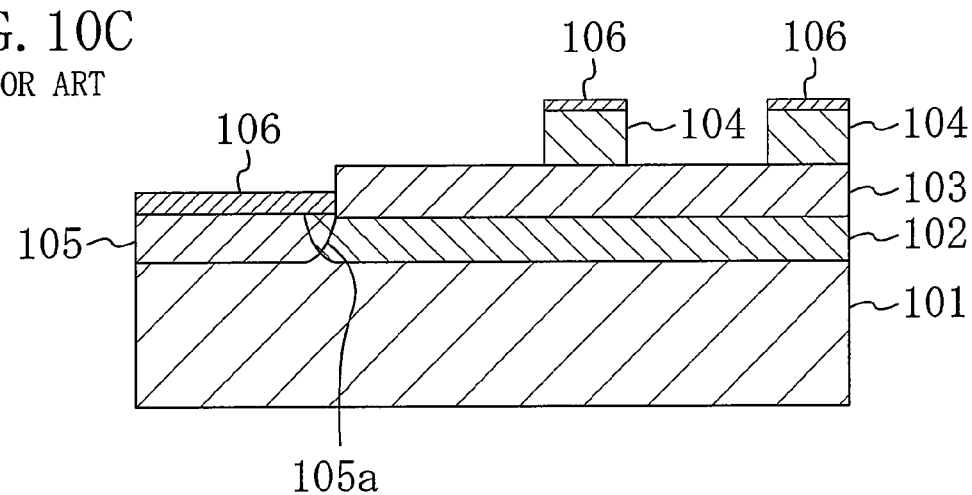

FIG. 9 is a section in the row direction of a semiconductor device according to the modified example in Embodiment 2 of the present invention. In FIG. 9, the same reference numerals are assigned to the same elements as those in FIG. 7 and the description thereof is omitted.

As shown in FIG. 9, in the semiconductor device according to the present modified example, the word line close to the connection parts 6a of the connection diffusion layers 6A out of the plurality of word lines 4 extending in the column direction is used as a dummy word line 40A, wherein the dummy word line 40A has width greater than the word lines 4.

It is noted that the width of the dummy word line 40A is preferably in the range between 1.5 times and three times the width of the word lines 4.

As described above, since the width of the dummy word line 40A is set greater than that of the word lines 4, it is unlikely that the implanted ion diffuses inwards of the cell array even if the mask for ion implantation for forming the connection diffusion layers 6A would be displaced inwards of the cell array. As a result, thermal diffusion thereafter causes no characteristic variation of the memory cells.

As described above, in the semiconductor device and the semiconductor device manufacturing method according to the present invention, the connection parts of the connection diffusion layers to the bit line diffusion layers are expanded without relying on the thermal diffusion, attaining miniaturization of the memory cells easily. Hence, the present invention is useful especially in semiconductor devices including overlapped connection parts for electrical connection between diffused layers as bit lines and other diffusion layers (connection diffusion layers) and methods for manufacturing the semiconductor devices.

What is claimed is:

1. A method for manufacturing a semiconductor device that includes a semiconductor region; a plurality of bit line diffusion layers formed in an upper portion of the semiconductor region and each extending in a row direction; a plurality of bit line insulating films formed on the bit line diffusion layers; a plurality of gate insulting films formed between the respective adjacent bit line diffusion layers on the semiconductor region; a plurality of word lines each formed on the semiconductor region in a column direction and each intersecting with the bit line insulating films and the gate insulating films; and memory cells formed at intersections of the gate insulating films and the word lines, the method comprising the steps of:
    (a) forming the plurality of bit line diffusion layers each extending in the row direction in the upper portion of the semiconductor region;
    (b) forming the bit line insulating films on the plurality of bit line diffusion layers;
    (c) forming the plurality of word lines each extending in the column direction on the semiconductor region so as to intersect with each of the bit line diffusion layers and each of the bit line insulating films;
    (d) forming exposed regions for exposing respective ones of end portions of the bit line diffusion layers by removing regions of the bit line insulating films from end portions thereof to a word line close to the respective one end portions thereof, the region including at least the respective one end portions of the bit line diffusion layers; and
    (e) forming connection parts in regions including the exposed regions and connection diffusion layers electrically connected to the bit line diffusion layers through the connection parts by selectively forming, in the semiconductor region, a plurality of diffusion layers each extending in the row direction of the semiconductor region.

2. The method of claim 1,
wherein the semiconductor region is made of silicon, and
the method further comprising a step (f) of forming, after the step (e), on at least some of the connection parts, a metal silicide layer formed by silicidation.

3. The method of claim 1,
wherein in the step (e), the connection diffusion layers are formed so as to have diffusion depth greater than diffusion depth of the bit line diffusion layers.

4. The method of claim 1,
wherein in the step (c), a word line out of the plurality of word lines which is close to a region where the connection parts are formed is formed as a dummy word line that does not contribute to operation, and
in the step (e), each of the connection diffusion layers is formed so that each of the connection parts extends to part under the dummy word line.

5. The method of claim 4,
wherein in the step (c), the dummy word line is formed so as to have width greater than width of the word lines.

6. The method of claim 1, further comprising:
a step (g) of forming, after the step (e), an interlayer insulating film on the semiconductor region including the plurality of connection diffusion layers and the plurality of word lines; and
a step (h) of forming, in the interlayer insulating film, bit line contacts to be in electrical contact with the connection diffusion layers.

* * * * *